United States Patent
Strijker

(10) Patent No.: US 11,057,041 B1
(45) Date of Patent: Jul. 6, 2021

(54) SELF-CALIBRATING SINGLE SLOPE ANALOG-TO-DIGITAL CONVERTER

(71) Applicant: NXP B.V., Eindhoven (NL)

(72) Inventor: Joan Wichard Strijker, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/038,329

(22) Filed: Sep. 30, 2020

(51) Int. Cl.
  *H03M 1/06* (2006.01)
  *H03M 1/56* (2006.01)
  *H03M 1/00* (2006.01)

(52) U.S. Cl.
  CPC .......... *H03M 1/0604* (2013.01); *H03M 1/00* (2013.01); *H03M 1/56* (2013.01)

(58) Field of Classification Search
  CPC ......... H03M 1/0604; H03M 1/56; H03M 1/00
  USPC ........................................ 341/121, 155, 169
  See application file for complete search history.

(56) References Cited

U.S. PATENT DOCUMENTS

| | | | |
|---|---|---|---|
| 7,924,207 B2 | 4/2011 | Snoeij et al. | |
| 8,659,465 B2 * | 2/2014 | Simony | H03M 1/58 341/169 |
| 2011/0169990 A1 * | 7/2011 | Higuchi | H03K 4/48 348/302 |

OTHER PUBLICATIONS

J. Adsul, et al., "A new method of reconfigurable ADC using calibrated programmable slopes," 2016 International Conference on Communication Electronics Systems (ICCES), Coimbatore, pp. 1-6. (2016) (doi: 10.1109/CESYS.2016.7889985).
S. Huang, et al., "An Automatic Slope-Calibrated Ramp Generator for Single-Slope ADCs," 2019 IEEE 13th International Conference on ASIC (ASICON), Chongqing, China, pp. 1-4, (2019). (doi: 10.1109/ASICON47005.2019.8983657).

* cited by examiner

*Primary Examiner* — Khai M Nguyen
(74) *Attorney, Agent, or Firm* — Rajeev Madnawat

(57) ABSTRACT

Various embodiments relate to a single slope analog to digital converter (ADC), including: a voltage slope generator configured to generate a voltage slope based upon a fixed current and variable current; an analog comparator configured to compare a voltage to a voltage output from the voltage slope generator; a first register configured to store a first count based upon a reference voltage being input into the analog comparator; a second register configured to store a second count based upon an input voltage being input into the analog comparator, wherein the input voltage is the voltage to be converted to a digital value by the ADC; and a digital to analog converter (DAC) configured to produce a slope trim signal based upon the voltage slope output by the voltage slope generator, the first count, and a count target associated with the voltage reference, wherein the variable current in the voltage slope generator is based upon the slope trim signal.

21 Claims, 3 Drawing Sheets

(12) United States Patent
US 11,057,041 B1

SELF-CALIBRATING SINGLE SLOPE ANALOG-TO-DIGITAL CONVERTER

TECHNICAL FIELD

Various exemplary embodiments disclosed herein relate generally to a self-calibrating single slope analog-to-digital converter (ADC).

BACKGROUND

Single slope analog-to-digital converters (ADC) are widely used in a variety of different electronic systems because of their simplicity. The accuracy of the conversion may be improved by compensation and calibration.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a single slope analog to digital converter (ADC), including: a voltage slope generator configured to generate a voltage slope based upon a fixed current and variable current; an analog comparator configured to compare a voltage to a voltage output from the voltage slope generator; a first register configured to store a first count based upon a reference voltage being input into the analog comparator; a second register configured to store a second count based upon an input voltage being input into the analog comparator, wherein the input voltage is the voltage to be converted to a digital value by the ADC; and a digital to analog converter (DAC) configured to produce a slope trim signal based upon the voltage slope output by the voltage slope generator, the first count, and a count target associated with the voltage reference, wherein the variable current in the voltage slope generator is based upon the slope trim signal.

Various embodiments are described, wherein the voltage slope generator includes: a fixed current source configured to generate the fixed current; and a voltage to current (VI) converter configured to convert the slope trim signal into the variable current, wherein the fixed current and the variable current are combined to produce a slope current used to generate the voltage slope.

Various embodiments are described, wherein the voltage slope generator includes voltage to current (VI) converter configured to convert the slope trim signal into the variable current, wherein VI converter produces the fixed current and combines the fixed current with the variable current to produce a slope current used to generate the voltage slope.

Various embodiments are described, wherein the DAC further includes: a control regulator configured to receive a difference between the first count and a count target; a digital comparator configured to compare an output of the control regulator and a counter; and a sample and hold circuit configured to sample the voltage slope based upon an output of the comparator, wherein the output of the sample and hold circuit is the slope trim.

Various embodiments are described, wherein the control regulator is a digital integrator.

Various embodiments are described, wherein the control regulator is a digital proportional-integral-derivative regulator.

Various embodiments are described, wherein the control regulator is a digital proportional-integral regulator.

Various embodiments are described, wherein the sample and hold circuit includes a switch controlled by the output of the digital comparator and a capacitor.

Various embodiments are described, further comprising an analog buffer connected between the output of the voltage slope generator and the sample and hold circuit.

Various embodiments are described, further including: a switch with an output connected to the analog comparator and a first input configured to receive the reference voltage and a second input configured to receive the input voltage; and a controller configured to actuate the switch between the first input and the second input.

Various embodiments are described, wherein the controller is further configured to determine when the output of the DAC has settled.

Various embodiments are described, wherein the voltage slope generator further includes a slope switch and the wherein the controller is further configured to control the slope switch in order to generate the voltage slope.

Various embodiments are described, wherein the second count indicates a digital value corresponding to the input voltage.

Further various embodiments relate to a method for converting an analog voltage to a digital value using a single slope analog to digital converter (ADC), including: generating a voltage slope based upon a fixed current and variable current; comparing the reference voltage to the voltage output from the generated voltage slope and storing a first count based upon the reference voltage; comparing an input voltage to the voltage output from the generated voltage slope and storing a second count based upon the input voltage; producing a slope trim signal based upon the voltage slope, the first count, and a count target associated with the voltage reference, wherein the slope trim signal is used to generate the variable current.

Various embodiments are described, wherein generating a voltage slope includes: generating the fixed current; voltage converting the slope trim signal into the variable current; combining the fixed current and the variable current to produce a slope current; and converting the slope current into the voltage slope.

Various embodiments are described, wherein the wherein generating a voltage slope includes actuating a slope switch to generate the voltage slope.

Various embodiments are described, wherein producing a slope trim signal further includes: integrating a difference between the first count and a count target; comparing an integrated difference to a clock value; and sampling and holding the buffered generated voltage slope to produce a slope trim signal when the clock value is equal to the digital input value.

Various embodiments are described, wherein sampling and holding the buffered generated voltage slope includes actuating a switch based upon a comparison of the reference voltage to the voltage output and applying the output voltage of the switch to a capacitor.

Various embodiments are described, further comprising buffering the voltage slope.

Various embodiments are described, further including: applying the reference voltage to the comparator until the slope trim signal has settled; and applying the input voltage to the comparator.

Various embodiments are described, wherein the second count indicates a digital value corresponding to the input voltage.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Figure 1:
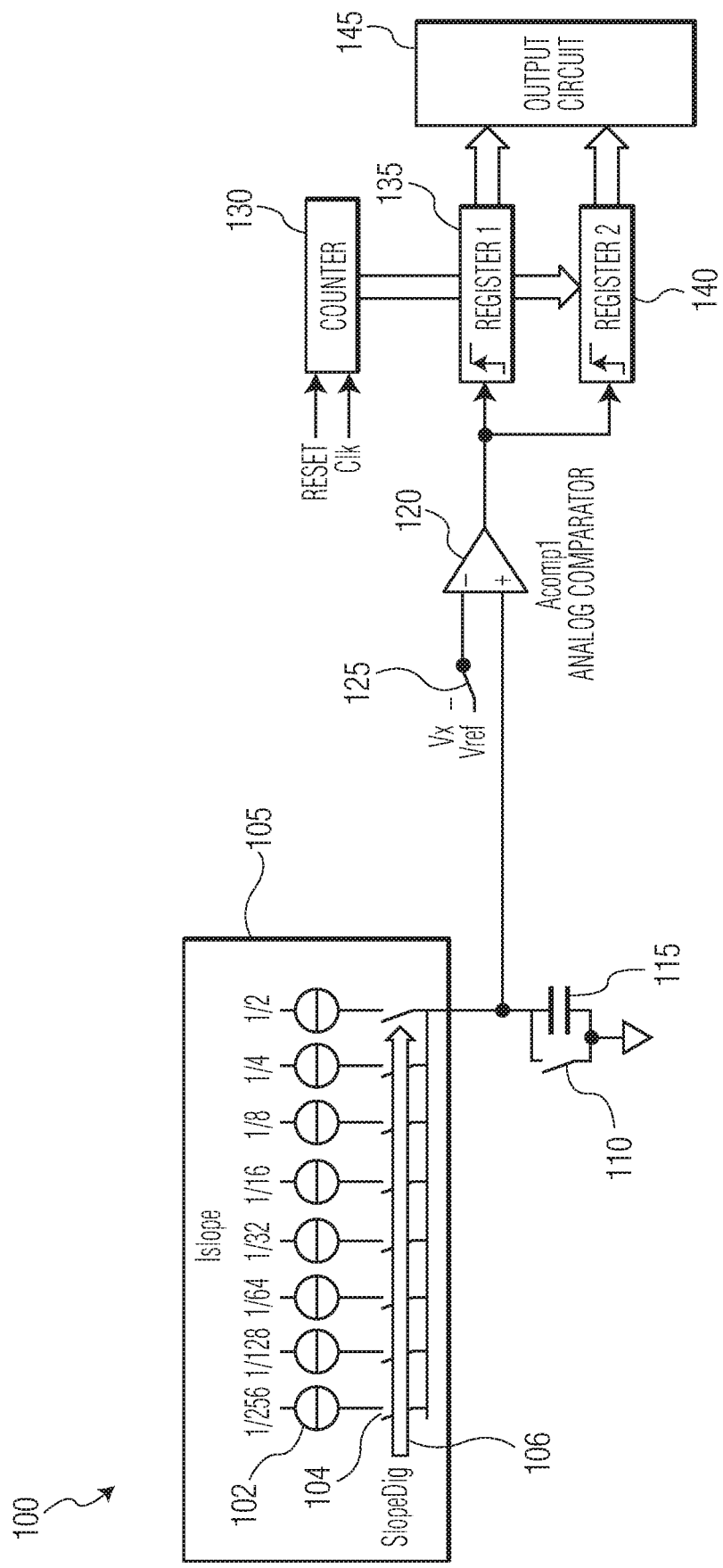
FIG. 1 illustrates a basic single slope ADC.

ADCs may be implemented using a voltage slope. FIG. 1 illustrates a basic single slope ADC 100. A voltage slope is created with a current source 105 producing a current Islope and capacitor Cslope 115. The dv/dt of the voltage slope is Islope/Cslope. The current source 105 may be a digitally controlled current source. The current source may include a plurality of different current sources 102. In this specific example eight different current sources 102 are Shown with Values of 1/256, 1/128, 1/64, 1/32, 1/16, 1/8, 1/4, and 1/2. The Current Source 105 includes a plurality of switches 104 where each switch is connected to one of the current sources 102. A control signal 106 will control each of the plurality of switches 104 in order to achieve a desired current value.

The voltage slope is started by opening slope switch 110. As soon as the voltage slope starts, a counter 130, producing a count, is also started by removing a Reset signal input into the counter 130. The counter also receives a clock signal Clk that cause the counter to increment with each clock cycle.

For calibration, a reference voltage Vref (as selected by a switch 125) and the voltage slope are connected to an analog comparator 120. When the voltage slope reaches the reference voltage Vref, the comparator 120 trips causing the current counter value to be stored in first register (Reg1) 135. This count Ref1 is indicative of the analog voltage value Vref and provides a calibration basis.

To convert an analog voltage, Vx, to a digital value, the analog voltage Vx is connected to the analog comparator 120. Switch 125 is used to connect either the reference voltage Vref or the analog voltage Vx to the comparator 120. As soon as the voltage slope starts, a counter 130, producing a count Count, is also started by removing a Reset signal input into the counter 130. Again, when the voltage slope reaches the analog voltage Vx, the comparator 120 trips and the counter value is stored in a second register (Reg2) 140 indicative of the analog voltage value Vx.

If the offset and the delay of the comparator are neglected, Reg1 135 and Reg2 140 will store the values:

$$Reg1 = Fclk \frac{Vref}{dvdt}; \text{and} \quad (1)$$

$$Reg2 = Fclk \frac{V_x}{dvdt}. \quad (2)$$

Fclk is the clock frequency used for the counter and dvdt is the voltage slope Islope/Cslope.

The value of Vx may then be calculated as:

$$V_x = Reg2 \frac{Vref}{Reg1}. \quad (3)$$

By using the reference voltage, the value of the clock frequency and the slope value is not needed for the analog to digital conversion.

In order to simplify the calculation of Vx, the slope current may be adjusted in response to the register value so that dvdt is adjusted such that the register holds the target value after a number of analog to digital cycles. For example, the first register 135 may hold the value (Reg1) 1000 for a reference voltage of 1V.

As the slope was trimmed in the previous step, the second register value Reg2 does not need any calculation to find Vx. In this example where the first register holds the value 1000 for an input voltage of 1V, Vx would be 548 mV if Reg2 stored the value 548.

Although the conversion can also be done without a trimmed slope, the value of Vx may be found by calculation using (3), it is advantageous to have direct relation between the register value and voltage when many calculations need to be done and/or computing power is limited.

A limitation of this solution is that the digital current source is increasingly difficult to realize when more bits are required resulting in differential non-linearity (DNL) errors. The current sources need to be made with very high accuracy. For 10 bits, the current source matching requirement would be 0.1%.

Figure 2:
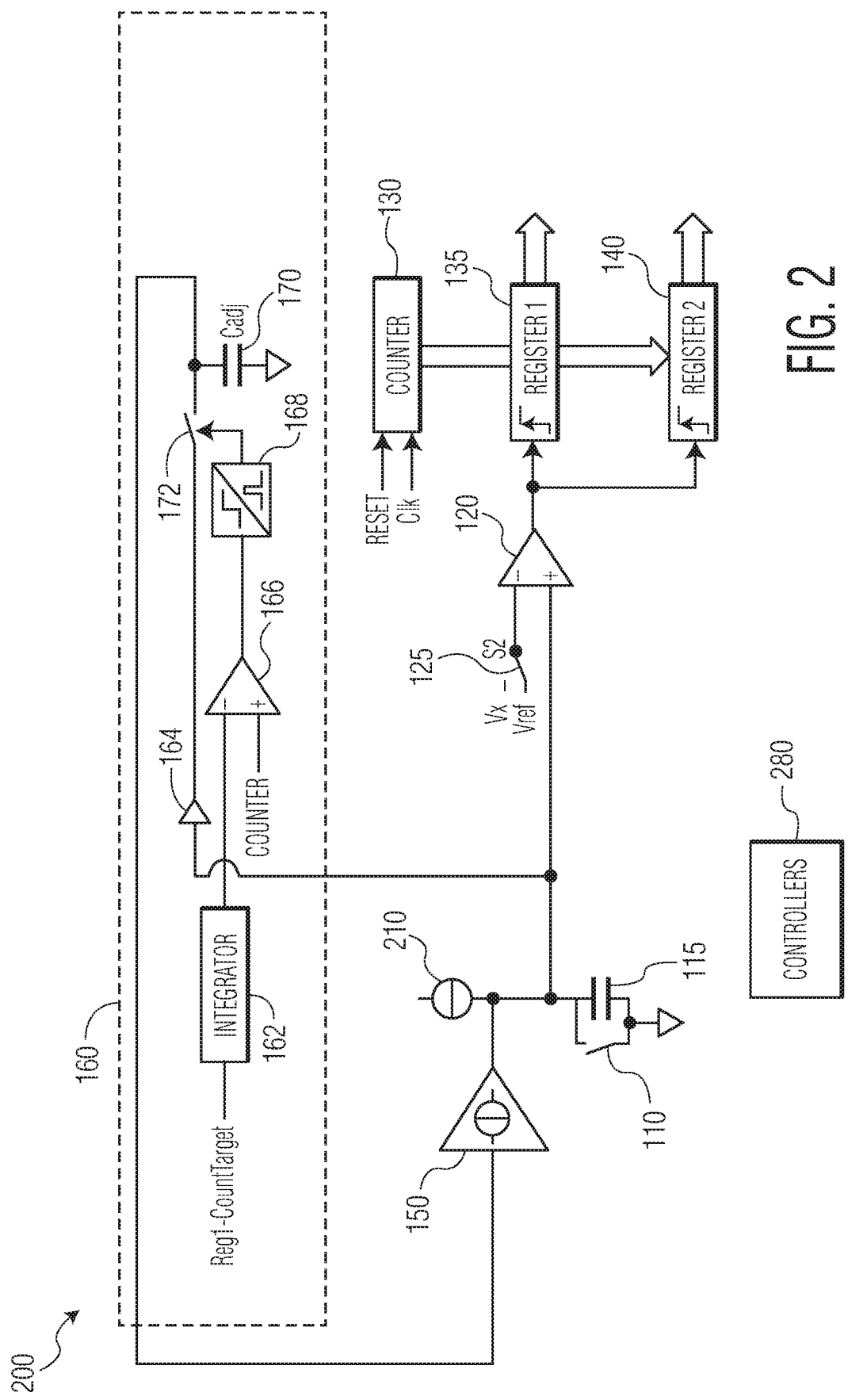
FIG. 2 illustrates an embodiment of a self-calibrating single slope ADC.

FIG. 2 illustrates an embodiment of a self-calibrating single slope ADC. The ADC 200 is similar to the ADC 100 of FIG. 1, but uses a different structure and method for generating the slope current. The digital adjustable current source 105 is replaced by a fixed current source 210 and a voltage to current (VI) converter 150. The input voltage for the VI converter 150 is created by a digital to analog converter (DAC) 160.

The DAC 160 is a single slope DAC that uses the same slope as the ADC. The DAC 160 includes a digital integrator 162, a digital comparator 166, a pulse circuit 168, a capacitor (Cadj) 170, a sample and hold switch 172, and a buffer 164. The digital integrator 162 sums the error value Reg1− CountTarget, where CountTarget is the target value for Reg1 in the first register 135 for a specific voltage value, e.g., 1000 when the input voltage is 1V. The output of the digital integrator 162 is connected to a digital comparator 166. The digital comparator 166 trips when the counter value reaches the integrator value. The pulse circuit 168 creates a pulse based upon the edge of the digital comparator 166 output. This output pulse closes the sample and hold switch 172 and samples the voltage slope. For a practical implementation, the voltage slope is buffered by buffer 164 to prevent disturbance of the voltage slope due to the sampling of the voltage slope by the sample and hold switch 172. The sampled voltage slope becomes a trim voltage Vslopetrim that is stored on capacitor Cadj 170.

Because the calibration is in a closed loop (i.e., the error Reg1-CountTarget is summed over time), errors caused by the offset of the buffer 164 or sampling errors in the voltage stored on the capacitor Cadj 170, are compensated.

The current for creating the slope cannot be generated only by the VI converter 150 with a one to one relation of the voltage and the current (i.e., Islope=gm*VslopeTrim, with gm the transconductance of the VI converter 150). This would create a chicken and egg problem: because the trim voltage VslopeTrim would have a one to one relation to the slope, and the slope would have a one to one relation to the trim voltage, so no solution would be available.

If the slope current is only partially generated by the VI converter 150 and the other part of the slope current (Ifixed) is generated by a fixed current generator 210, the calibration loop may converge to the solution where Reg1=CountTarget, i.e., by using Islope=Ifixed+gm*VslopeTrim the feedback loop is able to converge on a system state where Reg1=CountTarget.

In another embodiment, the VI converter 150 may also have an offset current at the output or an offset voltage at the input such that there is no one to one relation of the voltage and current. The VI converter 150 then behaves the same as a VI converter with a one to one relation of voltage and current combined with a fixed current source. In this situation the offset current at the output is equal to the fixed current, i.e., Islope=Ivic=Ioffset+gm*Vslopetrim. Thus, such a single VI converter 150 may replace both the VI converter and fixed current generator.

For integrated circuits, uncalibrated errors for internal current sources may be as large as 20%, for example (dependent on the IC process used). If the fixed current source 210 supplies 80% of the current required for the target slope value, the VI converter 150 may supply the other 20%. The calibration loop will converge to the situation where Reg1=CountTarget in several analog to digital and digital to analog cycles.

As soon as Reg1=CountTarget the calibration loop is stabilized and an analog to digital conversion for the Vx voltage can be done. A controller 280 may detect when Reg1=CountTarget, then the switch 125 may be switched to allow the voltage Vx to be converted.

In a typical application the calibration loop is updated after one or more analog to digital conversion cycles of Vx. These updates are required because, for example, the fixed current source value can change with temperature or the voltage on the Cadj capacitor changes due to leakage currents. Also the transconductance of the VI converter 150 may change with temperature. Hence the calibration update may be done periodically based upon predetermined time intervals or every N ADC cycles.

Figure 3:
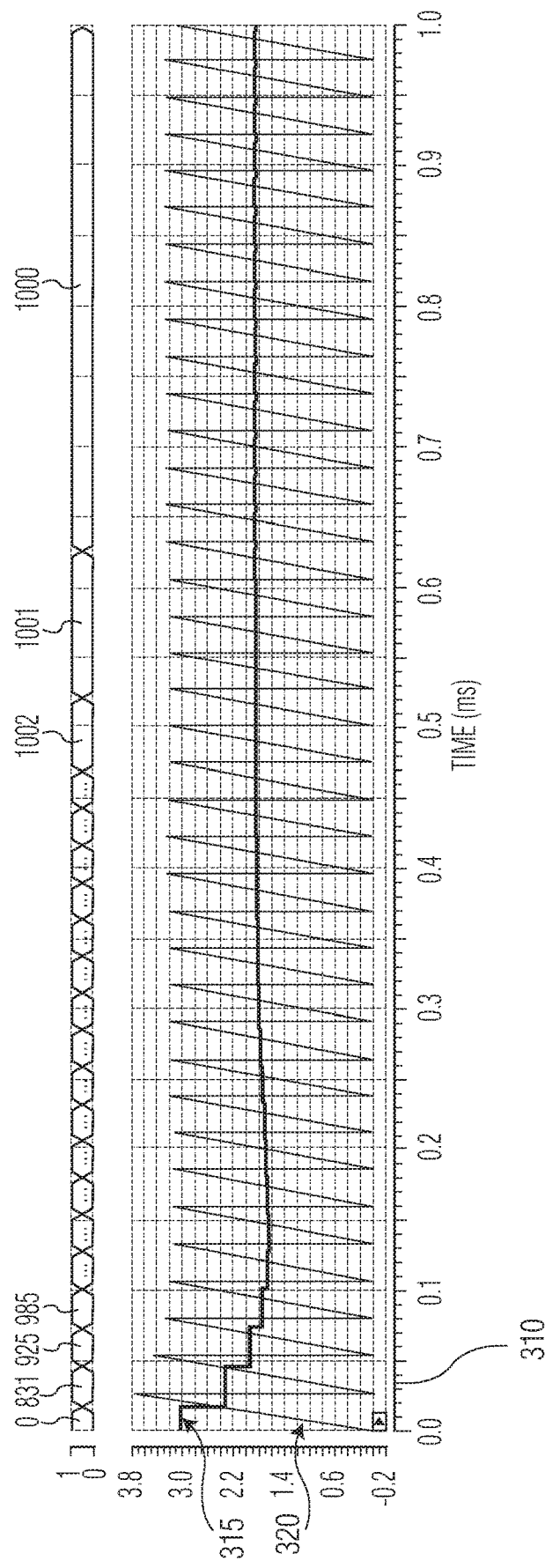
FIG. 3 includes plots that illustrate how the operation of the ADC settles and self-calibrates based upon a simulation of the ADC.

FIG. 3 includes plots that illustrate how the operation of the ADC 200 settles and self-calibrates based upon a simulation of the ADC. The top plot 305 illustrates the value stored in Reg1 over time. In this example, the register target value is 1000.

In the bottom graph the SlopeTrim voltage 315 and the voltage slope 320 are plotted over time. During the first cycles, the SlopeTrim voltage 315 is too high and consequently the voltage slope 320 is too steep and the Reg1 value 305 is too low. The calibration loop adjusts the SlopeTrim voltage by performing a digital to analog conversion cycle. The changed SlopeTrim voltage 315 changes the slope of the voltage slope 320 and consequently the Reg1 value 305. Depending on the ratio of the fixed current output by the fixed current generator 210 and the current output by the VI converter and depending on the integrator settings, after several cycles, the value Reg1 in the first register reaches the target value of 1000.

In an alternative embodiment, for a faster settling time of the calibration loop, the digital integrator can be replaced by a digital proportional-integral-derivative (PID) regulator, digital proportional-integral regulator, or any other suitable digital regulator.

The advantage the ADC disclosed herein over the existing art is that no digital adjustable current source is required. Further, the single slope DAC is used, and because in a single slope DAC the voltage slope is always rising, DNL errors are low. The difficult to design current source of FIG. 1 is replaced by a simple DAC circuit which has no difficult to design requirements. Errors in the calibration loop, e.g., offset in the buffer 164 or in the sample and hold switch 168/capacitor Cadj 170 combination, are compensated for by the integration in the calibration loop.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A single slope analog to digital converter (ADC), comprising:
   a voltage slope generator configured to generate a voltage slope based upon a fixed current and variable current;
   an analog comparator configured to compare a voltage to a voltage output from the voltage slope generator;
   a first register configured to store a first count based upon a reference voltage being input into the analog comparator;
   a second register configured to store a second count based upon an input voltage being input into the analog comparator, wherein the input voltage is the voltage to be converted to a digital value by the ADC; and
   a digital to analog converter (DAC) configured to produce a slope trim signal based upon the voltage slope output by the voltage slope generator, the first count, and a count target associated with the voltage reference,
   wherein the variable current in the voltage slope generator is based upon the slope trim signal.

2. The ADC of claim 1, wherein the voltage slope generator includes:
   a fixed current source configured to generate the fixed current; and a voltage to current (VI) converter configured to convert the slope trim signal into the variable current, wherein the fixed current and the variable current are combined to produce a slope current used to generate the voltage slope.

3. The ADC of claim 1, wherein the voltage slope generator includes voltage to current (VI) converter configured to convert the slope trim signal into the variable current, wherein VI converter produces the fixed current and combines the fixed current with the variable current to produce a slope current used to generate the voltage slope.

4. The ADC of claim 1, wherein the DAC further includes:
- a control regulator configured to receive a difference between the first count and a count target;
- a digital comparator configured to compare an output of the control regulator and a counter; and
- a sample and hold circuit configured to sample the voltage slope based upon an output of the comparator, wherein the output of the sample and hold circuit is the slope trim.

5. The ADC of claim 4, wherein the control regulator is a digital integrator.

6. The ADC of claim 4, wherein the control regulator is a digital proportional-integral-derivative regulator.

7. The ADC of claim 4, wherein the control regulator is a digital proportional-integral regulator.

8. The ADC of claim 4, wherein the sample and hold circuit includes a switch controlled by the output of the digital comparator and a capacitor.

9. The ADC of claim 4, further comprising an analog buffer connected between the output of the voltage slope generator and the sample and hold circuit.

10. The ADC of claim 1, further comprising:
- a switch with an output connected to the analog comparator and a first input configured to receive the reference voltage and a second input configured to receive the input voltage; and
- a controller configured to actuate the switch between the first input and the second input.

11. The ADC of claim 10, wherein the controller is further configured to determine when the output of the DAC has settled.

12. The ADC of claim 10, wherein the voltage slope generator further includes a slope switch and the wherein the controller is further configured to control the slope switch in order to generate the voltage slope.

13. The ADC of claim 1, wherein the second count indicates a digital value corresponding to the input voltage.

14. A method for converting an analog voltage to a digital value using a single slope analog to digital converter (ADC), comprising:
- generating a voltage slope based upon a fixed current and variable current;
- comparing a reference voltage to the voltage output from the generated voltage slope and storing a first count based upon the reference voltage;
- comparing an input voltage to the voltage output from the generated voltage slope and storing a second count based upon the input voltage;
- producing a slope trim signal based upon the voltage slope, the first count, and a count target associated with the voltage reference,
- wherein the slope trim signal is used to generate the variable current.

15. The method of claim 14, wherein generating a voltage slope includes:
- generating the fixed current;
- voltage converting the slope trim signal into the variable current;
- combining the fixed current and the variable current to produce a slope current; and
- converting the slope current into the voltage slope.

16. The method of claim 15, wherein the wherein generating a voltage slope includes actuating a slope switch to generate the voltage slope.

17. The method of claim 14, wherein producing a slope trim signal further includes:
- integrating a difference between the first count and a count target;
- comparing an integrated difference to a clock value; and
- sampling and holding the buffered generated voltage slope to produce a slope trim signal when the clock value is equal to the digital input value.

18. The method of claim 17, wherein sampling and holding the buffered generated voltage slope includes actuating a switch based upon a comparison of the reference voltage to the voltage output and applying the output voltage of the switch to a capacitor.

19. The method of claim 17, further comprising buffering the voltage slope.

20. The method of claim 14, further comprising:
- applying the reference voltage to the comparator until the slope trim signal has settled; and
- applying the input voltage to the comparator.

21. The method of claim 14, wherein the second count indicates a digital value corresponding to the input voltage.

* * * * *